United States Patent
Francis et al.

(10) Patent No.: US 11,211,921 B2
(45) Date of Patent: Dec. 28, 2021

(54) DIFFERENTIAL ANALOG INPUT BUFFER

(71) Applicant: Xilinx, Inc., San Jose, CA (US)

(72) Inventors: Roswald Francis, Dublin (IE); Christophe Erdmann, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/812,130

(22) Filed: Mar. 6, 2020

(65) Prior Publication Data
US 2021/0281251 A1    Sep. 9, 2021

(51) Int. Cl.
*H03K 17/12* (2006.01)
*H03K 3/356* (2006.01)
*H03K 3/021* (2006.01)
*H03K 17/16* (2006.01)
*H03K 19/003* (2006.01)
*H03K 17/687* (2006.01)

(52) U.S. Cl.
CPC ......... *H03K 3/35613* (2013.01); *H03K 3/021* (2013.01); *H03K 17/12* (2013.01); *H03K 17/16* (2013.01); *H03K 17/687* (2013.01); *H03K 19/00315* (2013.01)

(58) Field of Classification Search
CPC .... H03K 3/021; H03K 3/35613; H03K 17/10; H03K 17/102; H03K 17/12; H03K 17/122; H03K 17/16; H03K 17/668; H03K 17/687; H03K 19/0013; H03K 19/00315
See application file for complete search history.

(56) References Cited

U.S. PATENT DOCUMENTS

| | | | |
|---|---|---|---|
| 10,056,777 B2 * | 8/2018 | Kong | H04L 25/00 |
| 2009/0153248 A1 | 6/2009 | Sun et al. | |
| 2017/0373521 A1 | 12/2017 | Kong et al. | |
| 2019/0296756 A1 | 9/2019 | Ali | |

OTHER PUBLICATIONS

International Search Report and Written Opinion dated May 6, 2021, issued in International Appl. No. PCT/US2021/015026, filed Jan. 26, 2021.

* cited by examiner

*Primary Examiner* — Long Nguyen
(74) *Attorney, Agent, or Firm* — Paradice and Li LLP

(57) ABSTRACT

A differential signal input buffer is disclosed. The differential signal input buffer may receive a differential signal that includes a first signal and a second signal and may be divided into a first section and a second section and. The first section may buffer and/or amplify the first signal based on a first level-shifted second signal. The second section may buffer and/or amplify the second signal based on a first level-shifted first signal. In some implementations, the first section may buffer and/or amplify the first signal based on a second level-shifted second signal. Further, in some implementations, the second section may buffer and/or amplify the second signal based on a second level-shifted first signal.

18 Claims, 7 Drawing Sheets

DIFFERENTIAL ANALOG INPUT BUFFER

TECHNICAL FIELD

Aspects of the present disclosure relate generally to analog input buffers, and more specifically to differential analog input buffers with improved noise rejection.

BACKGROUND

Many modern circuits receive one or more analog signals for processing, filtering, amplification and the like. For example, an analog signal may be buffered for sampling by an analog-to-digital converter (ADC). Analog signals are often distributed in a differential format including two complementary signals where an electrical difference between the signals represents the analog signal. Analog signals are generally received through an input buffer to provide isolation and possible gain prior to further processing. In some cases, power supply noise may affect performance of the input buffer by directly affecting the input buffer output signal. Therefore, input buffers with increased power supply noise rejection are very desirable.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. Moreover, the systems, methods and devices of this disclosure each have several innovative aspects, no single one of which is solely responsible for the desirable attributes disclosed herein.

One innovative aspect of the subject matter described in this disclosure can be used to buffer differential signals. In some implementations, a differential signal buffer may include a first buffer circuit configured to receive a first level-shifted differential signal, and a second buffer circuit configured to receive a second level-shifted differential signal. The first buffer circuit may include a first NMOS transistor and a first PMOS transistor, where the drain of the first NMOS transistor is coupled to the drain of the first PMOS transistor. The first buffer circuit also may include a first power regulator coupled to the source of the first PMOS transistor and configured to receive the second level-shifted differential signal. The second buffer circuit may include a second NMOS transistor and a second PMOS transistor, where the drain of the second NMOS transistor is coupled to the drain of the second PMOS transistor. The second buffer circuit also may include a second power regulator coupled to the source of the second PMOS transistor and configured to receive the first level-shifted differential signal. The differential signal buffer is configured to buffer the first level-shifted differential signal based on the second level-shifted differential signal, and to buffer the second level-shifted differential signal based on the first level-shifted differential signal.

Another innovative aspect of the subject matter described in this disclosure can be implemented as a method for buffering a differential input signal. In some implementations, the method may include receiving a differential input signal, generating a first current based on a first level-shifted differential signal, generating a second current based on a second level-shifted differential signal, and generating a differential output signal based at least in part on the first current and the second current.

BRIEF DESCRIPTION OF THE DRAWINGS

The example implementations described herein are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Aspects of the present disclosure may be used to buffer differential analog signals. In some implementations, one or more power regulators may be used in conjunction with analog buffer circuits to provide an input buffer with improved power supply noise rejection that can be used to buffer differential signals. In some implementations, the power regulators also may increase a rejection of common-mode signals of the differential signals. In some aspects, the power regulators may provide the voltage and/or current for a first buffer circuit configured to buffer a first differential signal, and may adjust the voltage and/or current provided to the first buffer circuit based on a second differential signal. In some other aspects, the power regulator may adjust a voltage and/or current provided to an analog buffer circuit based at least in part on a power supply voltage or a ground voltage.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1:
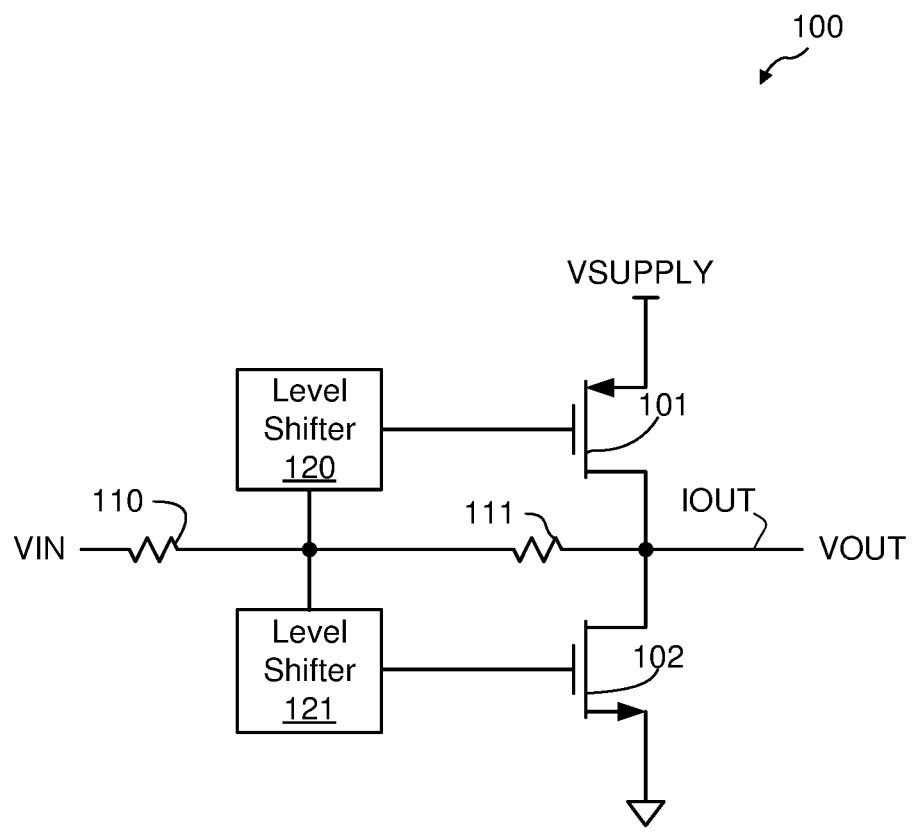
FIG. 1 shows a simplified circuit diagram of a conventional input buffer.

FIG. 1 shows a simplified circuit diagram of a conventional input buffer 100. The input buffer 100 may include a transistors 101 and 102, resistors 110 and 111, and level shifters 120 and 121. As shown, the input buffer 100 may receive an input signal VIN and generate an output signal VOUT. In some implementations, the input buffer 100 may be used to buffer differential signals. For example, the input buffer 100 may be instantiated twice such that each instantiation can buffer one-half of a differential signal.

In some implementations, transistor 101 may be a PMOS transistor and transistor 102 may be an NMOS transistor, and the input buffer 100 may operate as a CMOS buffer or inverter. As shown, drain terminals of the transistor 101 and the transistor 102 may be coupled together. The source of the transistor 101 may be coupled to a power supply (VSUPPLY), and the source of the transistor 102 may be coupled to ground. The gate of the transistor 101 may be coupled to an output terminal of the first level shifter 120, and the gate of the transistor 102 may be coupled to an output terminal of the second level shifter 121.

In other implementations, the transistors 101 and 102 may be any feasible transistor type. For example, the transistor 101 may be an NMOS transistor and the transistor 102 may be a PMOS transistor. In some other implementations, the transistors 101 and 102 may be the same transistor type (e.g., both NMOS or PMOS transistors). In addition, the input buffer 100 may include additional transistors not shown for simplicity. For example, one or more additional transistors may be used to provide bias currents and/or voltages for the input buffer 100. Further, in other implementations, other terminals of the transistors 101 and 102 may be coupled together.

The resistor 110 may be an input resistor, and the resistor 111 may be a feedback resistor. As shown, the resistor 110 may receive the input signal VIN and provide the input signal VIN to the gates of the transistor 101 and the transistor 102 via the level shifter 120 and the level shifter 121, respectively. In some implementations, the resistors 110 and 111 may determine at least part of a gain of the input buffer 100. For example, the gain of the input buffer 100 may be determined by a ratio between the resistance value of the resistor 111 and the resistance value of the resistor 110. Thus, in some implementations, the input buffer 100 may provide positive, negative, or unity gain based on the ratio of resistance values or the configurations of the resistors 110 and 111.

The level shifters 120 and 121 may move, transpose, or "level-shift" the input signal VIN to an appropriate voltage for operation of the transistors 101 and 102. Thus, the level shifter 120 may level-shift the voltage of VIN for operation of the transistor 101, and the level shifter 121 may level-shift the voltage of VIN for operation of the transistor 102. Level shifters are well-known in the art and are not described in detail herein.

Power to the input buffer 100 may be provided by VSUPPLY and returned to ground. Thus, VSUPPLY is coupled to the drain of the transistor 101, and ground is coupled to the drain of the transistor 102. In other implementations, power (VSUPPLY and ground) may be coupled to other terminals and/or devices.

An output signal of the input buffer 100 may be expressed as a polynomial that is a function of the input voltage and the power supply. For example, the output current IOUT of the input buffer 100 may be expressed as:

$$IOUT = a_0 + a_1 x + a_2 x^2 + a_3 x^3 \qquad (eq.\ 1)$$

where $a_0$-$a_n$ are constants, and x is a combination of the input voltage VIN and the power supply voltage VSUPPLY.

Thus, x may be expressed as:

$$x = (VIN + (k * VSUPPLY)) \qquad (eq.\ 2)$$

Further, $x^2$ may be expressed as:

$$x^2 = VIN^2 + k^2 VSUPPLY^2 + 2k(VIN)(VSUPPLY) \qquad (eq.\ 3)$$

Similar expressions may be determined for $x^3$ and other higher order terms not shown or discussed herein for simplicity. Thus, the power supply voltage VSUPPLY may affect the output current IOUT linearly (e.g., as shown in the $a_1$ term) and non-linearly (e.g., as shown in the $a_2$ and $a_3$ terms) in accordance with equation 1. Therefore, compensating or adjusting the output current IOUT based on the power supply voltage may reduce power supply related noise in the output current. Similar equations not expressed here may show a similar reduction of power supply related noise in the output voltage (VOUT) of the input buffer circuit 100.

Figure 2:
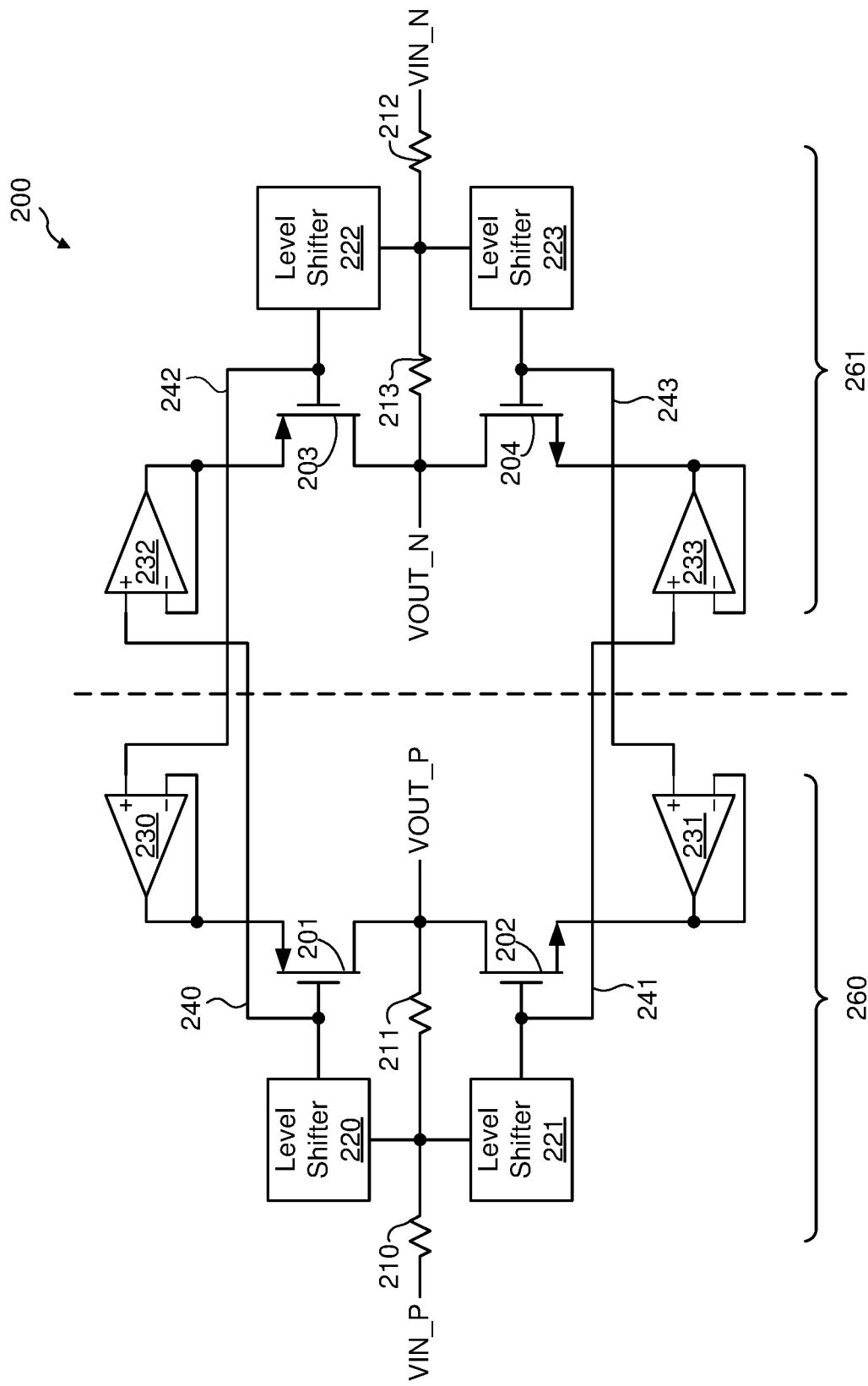
FIG. 2 shows a simplified circuit diagram of a differential input buffer, in accordance with some implementations.

FIG. 2 shows a simplified circuit diagram of a differential signal buffer 200, in accordance with some implementations. The differential signal buffer 200 may receive a differential input signal, and may generate a differential output signal based on the differential input signal. The differential input signal may include complementary input signals VIN_P and VIN_N, and the differential output signal may include complementary output signals VOUT_P and VOUT_N). The differential signal buffer 200 may include transistors 201-204, resistors 210-213, level shifters 220-223, and power regulators 230-233.

The differential signal buffer 200 may be divided into a first section 260 (to the left of the dashed line) and a second section 261 (to the right of the dashed line). The first section 260 may be arranged substantially similar to the second section 261. For the first section 260, transistors 201 and 202 are coupled in series between power regulators 230 and 231, with the commonly-coupled drain terminals of transistors 201 and 202 configured to provide a first output signal VOUT_P, the gate of transistor 201 coupled to an output terminal of level shifter 220, and the gate of transistor 202 coupled to an output terminal of level shifter 221. The level shifter 220 may generate a level-shifted input signal 240 for the gate of transistor 201, and the level shifter 221 may generate a level-shifted input signal 241 for the gate of transistor 202. The commonly-coupled drains of the transistors 201 and 202 may be coupled to the resistor 211. The resistor 210 may receive the input signal VIN_P and provide the input signal VIN_P to the level shifters 220 and 211, and also to the resistor 211.

For the second section 261, transistors 203 and 204 are coupled in series between power regulators 232 and 233, with the commonly-coupled drain terminals of transistors 203 and 204 configured to provide a second output signal VOUT_N, the gate of transistor 203 coupled to an output terminal of level shifter 222, and the gate of transistor 204 coupled to an output terminal of level shifter 223. Level shifter 222 may generate a level-shifted input signal 242 for the gate transistor 203, and level shifter 223 may generate a level-shifted input signal 243 for the gate of transistor 204. The commonly-coupled drains of the transistors 203 and 204 may be coupled to the resistor 213. The resistor 212 may receive the input signal VIN_N and provide the input signal VIN_N to the level shifters 222 and 223, and also to the resistor 213.

Each of the power regulators 230-233, which are depicted as voltage-following op-amps, may provide power (e.g., a voltage and/or current) based at least in part on a corresponding input signal. For example, the power regulator 230 provides power to the source of transistor 201 based on the level-shifted input signal 242 provided by level shifter 222, the power regulator 231 provides power to the source of transistor 202 based on the level-shifted input signal 243 provided by level shifter 223, the power regulator 232 provides power to the source of transistor 203 based on the level-shifted input signal 240 provided by level shifter 220, and the power regulator 233 provides power to the source of transistor 204 based on the level-shifted input signal 241 provided by level shifter 221.

In some implementations, the power regulator 230 may operate as a current source and provide current to transistors 201 and 202 based on the level-shifted input signal 242, and the power regulator 231 may operate as a current source and provide current to transistors 201 and 202 based on the level-shifted input signal 243. Similarly, the power regulator 232 may operate as a current source and provide current to transistors 203 and 204 based on the level-shifted input signal 240, and the power regulator 233 may operate as a current source and provide current to transistors 203 and 204 based on the level-shifted input signal 241.

Figure 3:
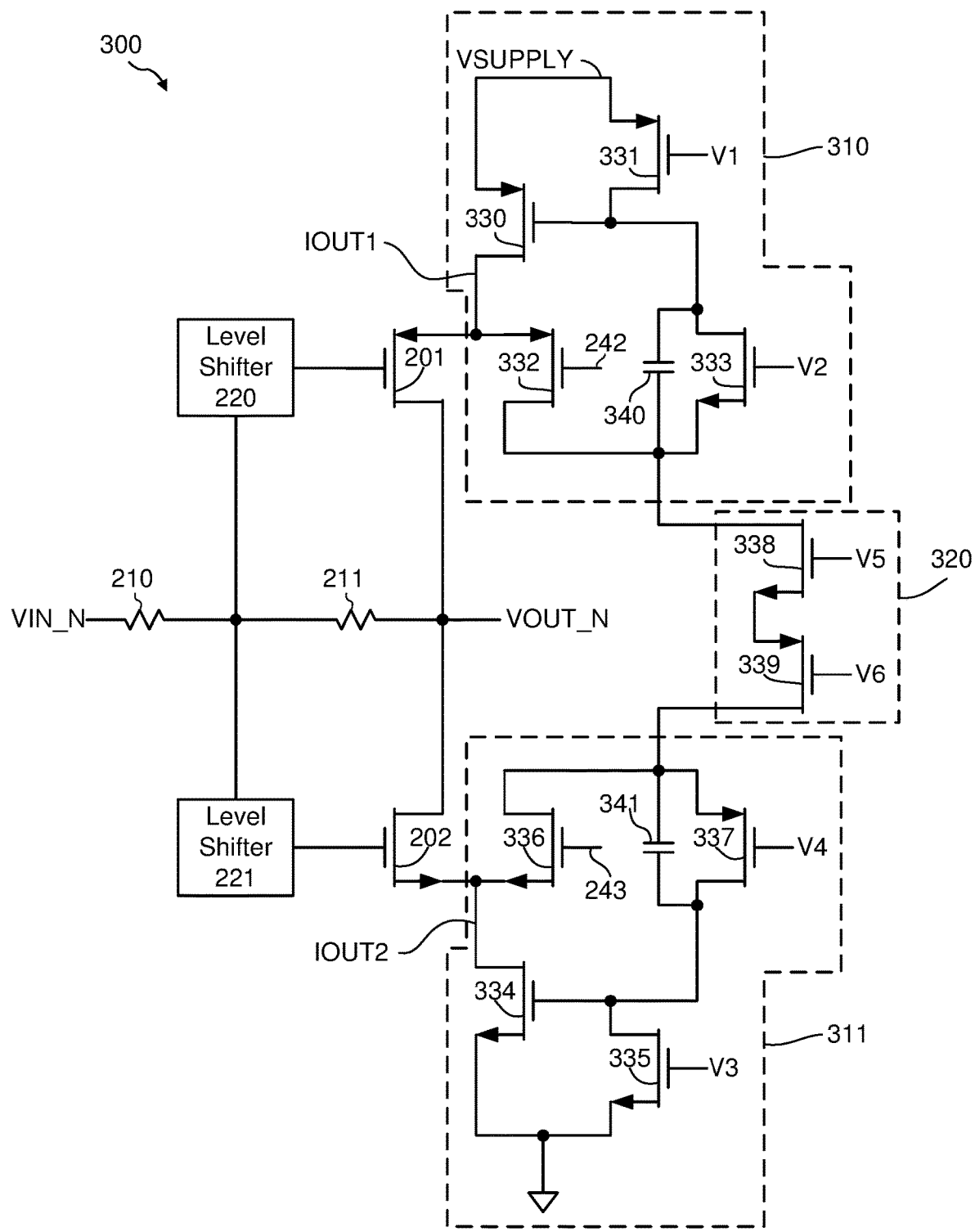
FIG. 3 shows a simplified circuit diagram of an example first section of a differential input buffer, in accordance with some implementations.

FIG. 3 shows a simplified circuit diagram of a first section 300 of a differential input buffer, in accordance with some implementations. The first differential input buffer section 300 of FIG. 3 may be an implementation of the first section 260 of the differential signal buffer 200 of FIG. 2. Thus, the first differential input buffer section 300 may include transistors 201 and 202, resistors 210 and 211, and level shifters 220 and 221 as described with respect to the differential signal buffer 200 of FIG. 2. The first differential input buffer section 300 may also include power regulators 310 and 311 and a current source 320. The power regulators 310 and 311 may be implementations of the power regulators 230 and 231, respectively.

The power regulator 310 may source or sync power (e.g., a current and/or voltage) to or from the transistors 201 and 202. For example, the power regulator 310 may provide an output current or an output voltage for the transistors 201 and 202. In some implementations, the power regulator 310 may include transistors 330-333 and a capacitor 340. In the example of FIG. 3, transistors 330-332 are shown as PMOS transistors, and transistor 333 is shown as an NMOS transistor. In other implementations, the transistors 330-333 may be any feasible type of transistor. The capacitor 340 is coupled between the source and drain terminals of transistor 333, and provides a high-frequency path that may improve the high frequency response of the output current IOUT1.

Transistor 330 may have a source coupled to a supply voltage (VSUPPLY), a drain coupled to the source of transistor 332, and a gate coupled to the drain of transistor 331 and to the drain of transistor 333. The source of transistor 331 may be coupled to the supply voltage, and the drain of transistor 331 may be coupled to the gate of transistor 330 and to the drain of transistor 333. The source of transistor 333 may be coupled to the drain of transistor 332 and to a current source 320. In some implementations, the gate of transistor 332 may receive the level-shifted input signal 242, and transistor 332 may control an output current IOUT1 provided to transistors 201 and 202 based at least in part on the level-shifted input signal 242.

The gate of transistor 331 receives a first bias voltage V1, and the gate of transistor 333 receives a second bias voltage V2. The bias voltages V1 and V2 may be generated by any feasible device or procedure. In some implementations, the transistors 331 and 333 are biased to enable the transistors 330 and 332 to provide the output current IOUT1 based on the level-shifted input signal 242. In some aspects, the transistors 330 and 332 may isolate the output current IOUT1 from voltage disturbances from the supply voltage, thereby increasing power supply noise rejection. Furthermore, controlling the output current IOUT1, at least in part, with the level-shifted input signal 242 (provided by the other section of the differential output buffer) may increase common-mode signal rejection.

The power regulator 311 also may source or sync power to or from the transistors 201 and 202. In some implementations, the power regulator 311 may include transistors 334-337 and a capacitor 341. In the example of FIG. 3, transistors 334-336 are shown as NMOS transistors, and transistor 337 is shown as a PMOS transistor. In other implementations, the transistors 334-337 may be any feasible type of transistor.

Transistor 334 may have a source coupled to ground, a drain coupled to the source of transistor 336, and a gate coupled to the drain of transistor 335 and to the drain of transistor 337. The source of transistor 335 may be coupled to ground, the drain of transistor 335 may be coupled to the drain of transistor 337, and the gate of transistor 335 may be coupled to a third bias voltage V3. The source of transistor 337 may be coupled to the drain of transistor 336, and the gate of transistor 337 may be coupled to a fourth bias voltage V4. The source of transistor 336 may be coupled to the drain of transistor 334, and the gate of transistor 336 may be coupled to the level-shifted input signal 243. In some implementations, the transistor 336 may control an output current IOUT2 received by the transistors 201 and 202.

The bias voltages V3 and V4 may be generated by any feasible device or procedure. In some implementations, the transistors 335 and 337 are biased to enable the transistors 334 and 336 to provide the output current IOUT2 based on the level-shifted input signal 243. In some aspects, the transistors 334 and 336 may isolate the output current IOUT2 from voltage disturbances from ground, thereby increasing power supply (in this case ground) noise rejection. Furthermore, controlling the output current IOUT2, at least in part, with the level-shifted input signal 243 (provided by the other section of the differential output buffer) may increase common-mode signal rejection.

The current source 320 includes transistors 338 and 339, and may enable current reuse by linking current to or from the power regulator 310 with currents to or from the power regulator 311. In some implementations, the gate of transistor 338 may be coupled to a fifth bias voltage V5, and the gate of the transistor 339 may be coupled to a sixth bias voltage V6.

Figure 4:
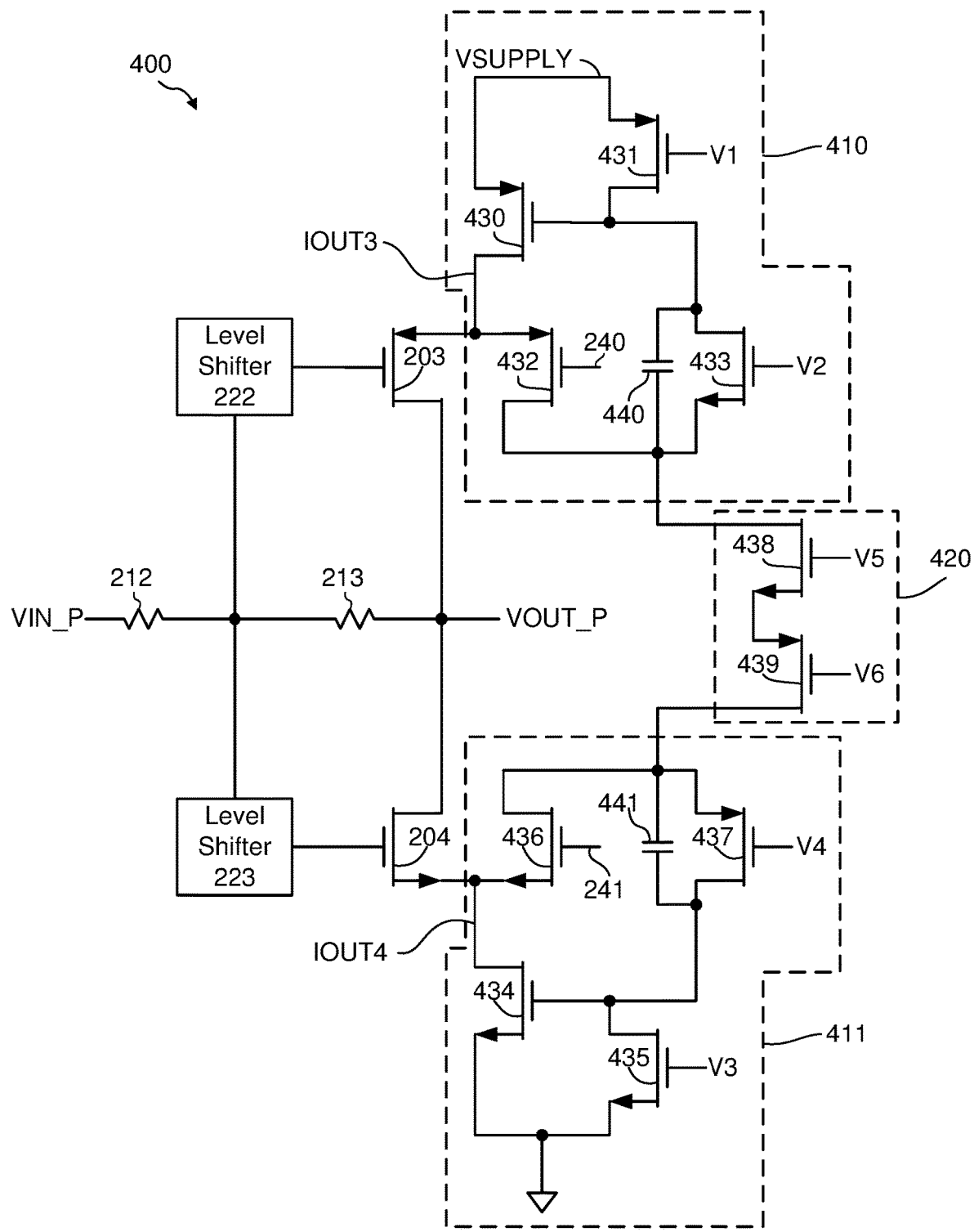
FIG. 4 shows a simplified circuit diagram of an example second section of a differential input buffer.

FIG. 4 shows a simplified circuit diagram of a second section 400 of a differential input buffer, in accordance with some implementations. The second differential input buffer section 400 may be an implementation of the second section 261 of the differential signal buffer 200 of FIG. 2. Thus, the second differential input buffer section 400 may include transistors 203 and 204, resistors 212 and 213, and level shifters 222 and 223 as described with respect to FIG. 2. The second differential input buffer section 400 may also include power regulators 410 and 411, and a current source 420.

The power regulator 410 may be an implementation of power regulator 232 of FIG. 2, and may be similar to the power regulator 310 of FIG. 3. In some implementations, the power regulator 410 may include transistors 430-433 and a capacitor 440. Transistors 430-433 and capacitor 440 may be configured in a manner similar to that of transistors 330-330 and capacitor 340, respectively, of FIG. 3. Thus, the transistors 430 and 432 may provide the current IOUT3 to the transistors 203 and 204 based at least in part on the level-shifted input signal 240. Similarly, the power regulator 411 may be an implementation of the power regulator 233 of FIG. 2, and may be similar to the power regulator 311 of FIG. 3. In some implementations, the power regulator 411 may include transistors 434-437 and a capacitor 441. The transistors 434-437 and capacitor 441 may be configured in a manner similar to that of transistors 334-337 and capacitor 341 of FIG. 3, respectively. Thus, the transistors 434 and 436 may provide the current IOUT4 for the transistors 203 and 204 based at least in the level-shifted input signal 241. The current source 420 includes transistors 438 and 439, and may be configured in a manner similar to that of transistors 338 and 339, respectively of FIG. 3.

Figure 5:
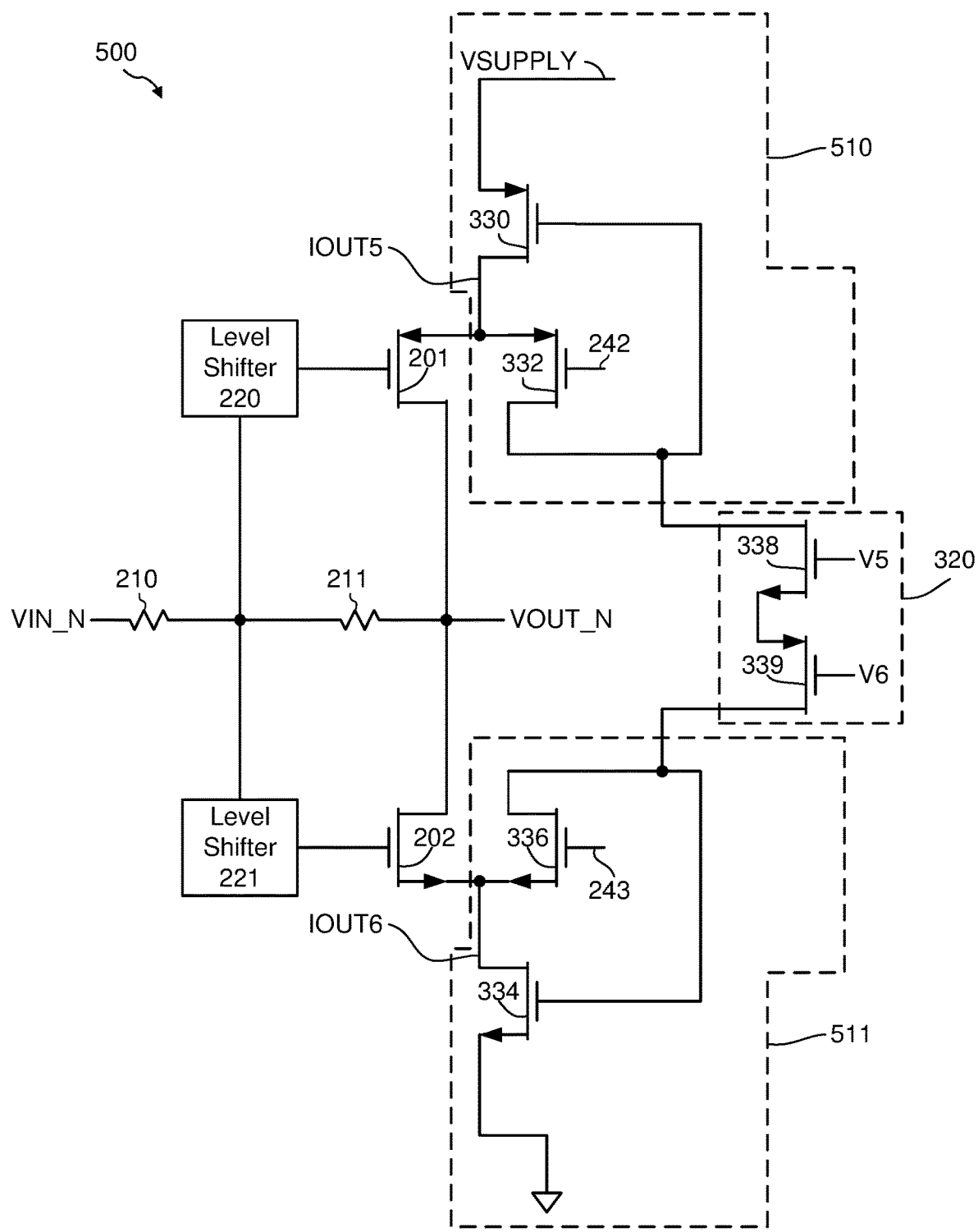
FIG. 5 shows a simplified circuit diagram of another example section of a differential input buffer, in accordance with some implementations.

FIG. 5 shows a simplified circuit diagram of another implementation of a differential input buffer section 500, in accordance with some implementations. In some implementations, the power regulators 310, 311, 410, and 411 described above may be simplified, reducing the parts count with only a small decrease in power supply or ground noise rejection performance. The differential input buffer section 500 may be used in place of the first differential input buffer section 300 of FIG. 3 and/or the second differential input buffer section 400 of FIG. 4. The differential input buffer section 500 may include transistors 201 and 202, resistors 210 and 211, level shifters 220 and 221, and the current source 320 arranged as described with respect to FIG. 3.

The differential input buffer section 500 may include a first power regulator 510 and a second power regulator 511. The power regulator 510 includes transistors 330 and 332, and may be configured in a manner similar to that of the power regulator 310 of FIG. 3. Thus, the source of the transistor 330 may be coupled to a supply voltage, the drain of transistor 330 may be coupled to the source of transistor 332, and the gate of transistor 330 may be coupled to the drain of transistor 332 and to the current source 320. Similar to the power regulator 310, the gate of transistor 332 may be coupled to the level-shifted input signal 242. An output current IOUT5 may be provided (e.g., sourced or synced) by the transistors 330 and 332. In contrast to the power regulator 310 of FIG. 3, the power regulator 510 includes only two transistors (transistors 330 and 332). Thus, design of the power regulator 510 is simplified, includes fewer components, and has a lesser requirement for bias voltages than the power regulator 310 of FIG. 3. In some implementations, the power regulator 510 may have increased susceptibility to power supply noise. However, the benefits of the power regulator 510 may include reduced area and a simpler implementation.

The power regulator 511 includes transistors 334 and 336, and may be configured in a manner similar to that of the power regulator 311. Thus, the source of transistor 334 may be coupled to ground, the drain of transistor 334 may be coupled to the source of transistor 336, and the gate of transistor 334 may be coupled to the drain of transistor 336 and to the current source 320. The gate of transistor 336 may be coupled to the level-shifted input signal 243. An output current IOUT6 may be provided by transistors 334 and 336. The current source 320 may function as described above with respect to FIG. 3.

Figure 6:
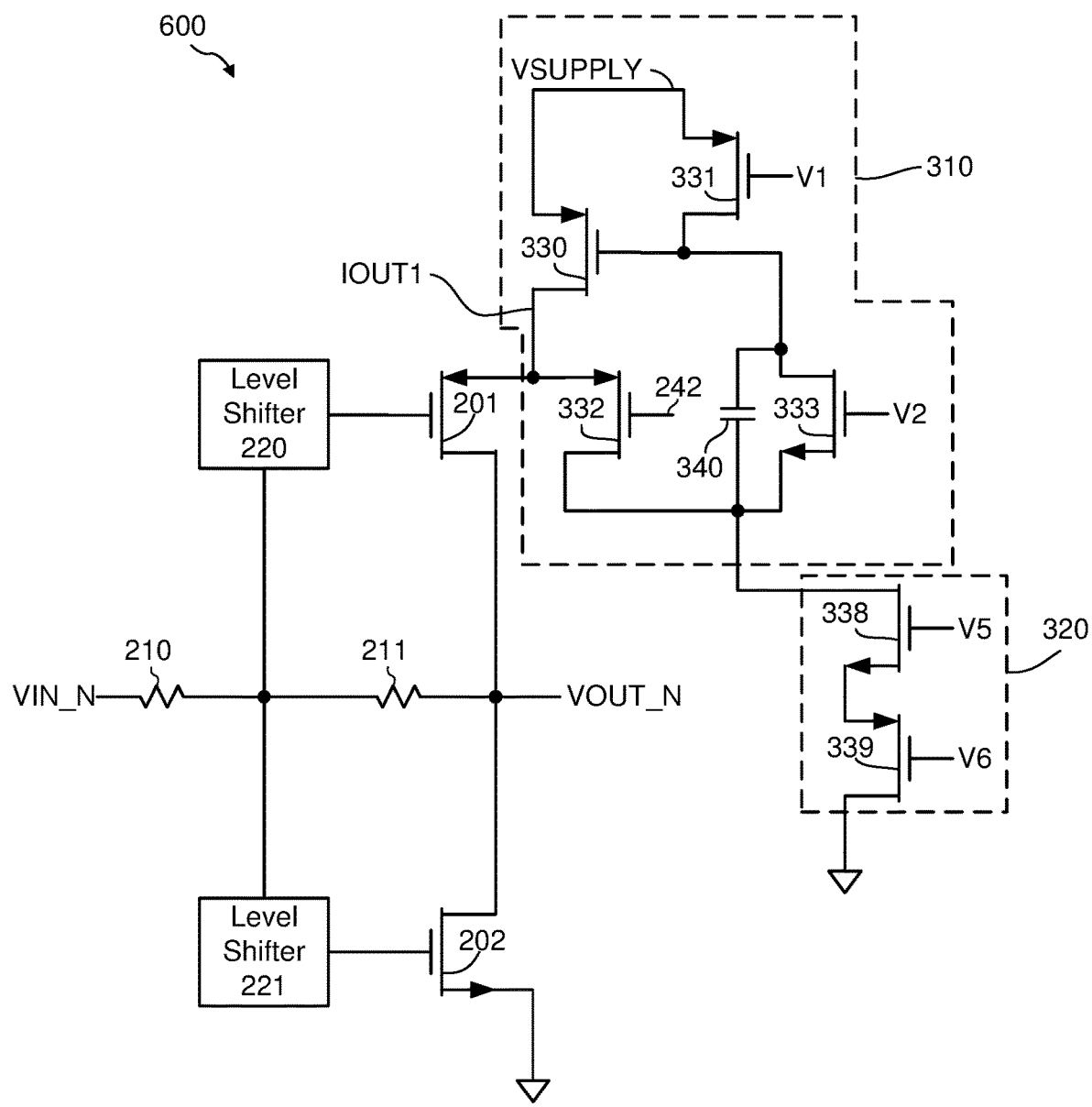
FIG. 6 shows a simplified circuit diagram of another implementation of another example section of a differential input buffer, in accordance with some implementations.

FIG. 6 shows a simplified circuit diagram of another implementation of a differential input buffer section 600, in accordance with some implementations. In some cases, the noise associated with the power supply may be greater than noise associated with ground, and therefore power regulators configured to reduce ground noise may be omitted to simplify implementation. The differential input buffer section 600 is similar to the first differential input buffer section 300 of FIG. 3, with the power regulator 311 omitted. Therefore, the differential input buffer section 600 may include transistors 201 and 202, resistors 210 and 211, level shifters 220 and 221, power regulator 310, and current source 320. The transistors 201, 202, 330-333, 338 and 339, resistors 210 and 211, level shifters 220 and 221, and capacitor 340 may be configured as described with respect to FIG. 3. Further, the source of transistor 202 and the current source 320 may be coupled to ground. In some other implementations, the power regulator 310 may be replaced with the power regulator 510 of FIG. 5, further simplifying the implementation of the differential input buffer section 600.

Figure 7:
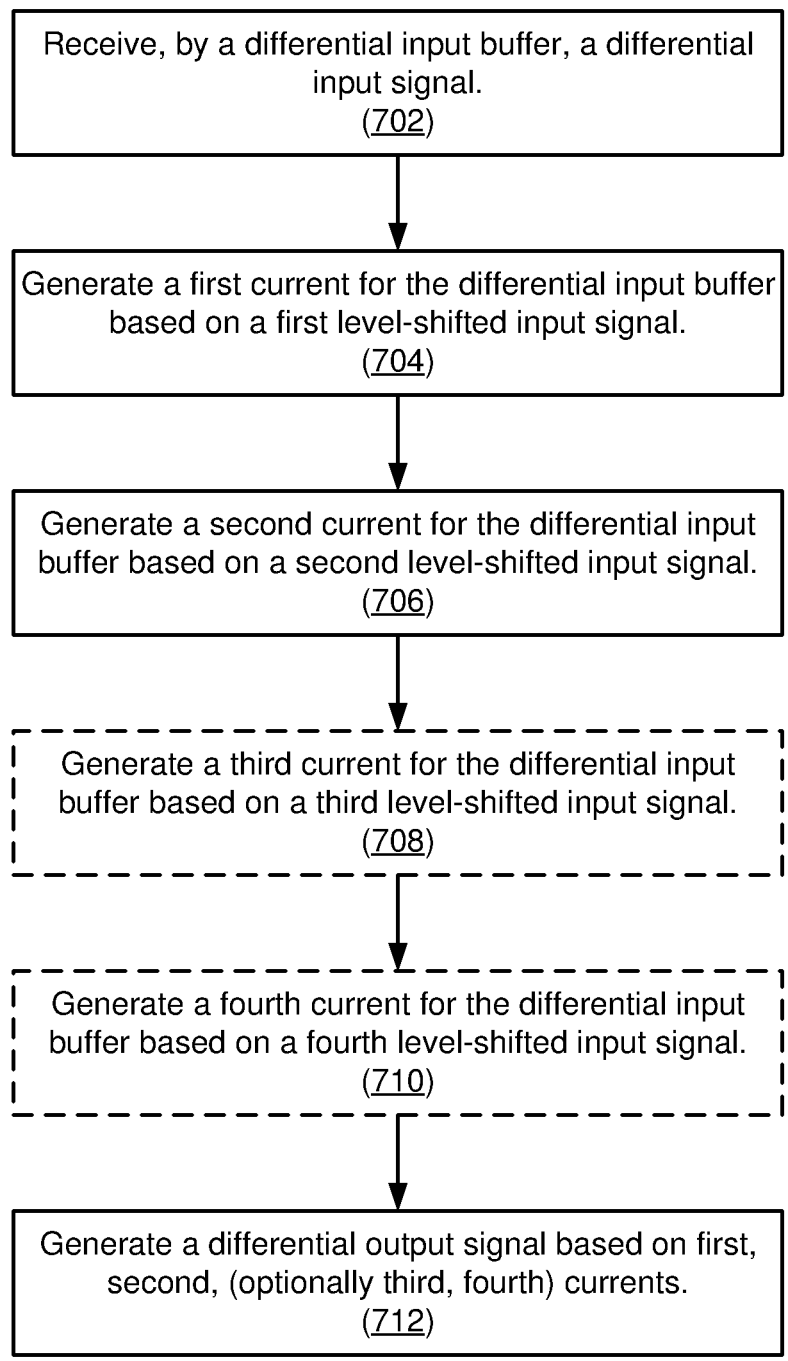
FIG. 7 shows an illustrative flowchart depicting an example operation for operating a differential input buffer, according to some implementations.

FIG. 7 shows an illustrative flowchart depicting an example operation 700 for operating a differential input buffer, according to some implementations. The operation 700 may be used to operate the differential signal buffer 200 of FIG. 2 or any other feasible differential input buffer.

The operation 700 may begin with receiving, by a differential input buffer, a differential input signal (702). Referring also to FIGS. 3 and 4, the differential input signal may include complementary input signals VIN_N and VIN_P. In some implementations, the differential input signal may be received by the differential input buffer sections 300 and 400 of FIGS. 3 and 4, respectively.

The operation 700 may proceed with generating a first current for the differential input buffer based on a first level-shifted input signal (704). The differential input buffer sections 300 and 400 may include power regulators 310, 311, 410, and 411. The power regulator 310 may generate a first current for the differential input buffer section 300 based on the first level-shifted input signal 242. In some implementations, the first level-shifted input signal 242 may be received by a gate of a transistor within the power regulator 310. For example, the first level-shifted input signal 242 may be received by the gate of transistor 332 to generate the first current.

The operation 700 may proceed with generating a second current for the differential input buffer based on a second level-shifted input signal (706). In some implementations, the power regulator 410 may generate a second current for the differential input buffer section 400 based on the second level-shifted input signal 240. In some implementations, the second level-shifted input signal 240 may be received by a gate of a transistor within the power regulator 410. For example, the second level-shifted input signal 240 may be received by the gate of transistor 432 to generate the second current.

The operation 700 may proceed with generating a third current for the differential input buffer based on a third level-shifted input signal (708). This operation may be optional, as indicated by the dashed lines. In some implementations, the power regulator 311 may generate a third current for the differential input buffer section 300 based on the third level-shifted input signal 243. In some implementations, the third level-shifted input signal 243 may be received by a gate of a transistor within the power regulator 311. For example, the third level-shifted input signal 243 may be received by the gate of transistor 336 to generate the third current.

The operation 700 may proceed with generating a fourth current for the differential input buffer based a fourth level-shifted input signal (710). This operation may be optional, as indicated by the dashed lines. In some implementations, the power regulator 411 may generate a fourth current for the differential input buffer section 400 based on the fourth level-shifted input signal 241. In some implementations, the fourth level-shifted input signal 241 may be received by a gate of a transistor within the power regulator 411. For example, the fourth level-shifted input signal 241 may be received by the gate of transistor 436 to generate the fourth current.

The operation 700 may proceed with generating a differential output signal based on the first current, the second current, and optionally the third current and the fourth current (712). In some implementations, the first current from the power regulator 310 and the second current from the power regulator 410 may be used to generate the differential output signal. In some other implementations, the third current from the power regulator 311 and the fourth current from the power regulator 411 also may be used to generate the differential output signal.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A differential signal buffer, comprising:
    a first buffer circuit configured to receive a first level-shifted differential signal, the first buffer circuit comprising:
        a first NMOS transistor;
        a first PMOS transistor, wherein a drain of the first NMOS transistor is coupled to a drain of the first PMOS transistor; and
        a first power regulator coupled to a source of the first PMOS transistor and configured to receive a second level-shifted differential signal; and
    a second buffer circuit configured to receive the second level-shifted differential signal, the second buffer circuit comprising:
        a second NMOS transistor;
        a second PMOS transistor, wherein a drain of the second NMOS transistor is coupled to a drain of the second PMOS transistor; and
        a second power regulator coupled to a source of the second PMOS transistor and configured to receive the first level-shifted differential signal,
    wherein the first buffer circuit is configured to buffer the first level-shifted differential signal based on the second level-shifted differential signal, and the second buffer circuit is configured to buffer the second level-shifted differential signal based on the first level-shifted differential signal.

2. The differential signal buffer of claim 1, wherein the first power regulator is configured to provide a first current to the first NMOS transistor and to the first PMOS transistor based on the second level-shifted differential signal.

3. The differential signal buffer of claim 2, wherein the second power regulator is configured to provide a second current to the second NMOS transistor and to the second PMOS transistor based on the first level-shifted differential signal.

4. The differential signal buffer of claim 2, wherein the first power regulator comprises:
    a third PMOS transistor; and
    a fourth PMOS transistor, wherein a source of the third PMOS transistor is coupled to a power supply, a drain of the third PMOS transistor is coupled to a source of the fourth PMOS transistor, and a gate of the fourth PMOS transistor is configured to receive the second level-shifted differential signal.

5. The differential signal buffer of claim 4, wherein the first current is provided by at least one of the third PMOS transistor or the fourth PMOS transistor.

6. The differential signal buffer of claim 4, wherein the first power regulator further comprises:
    a fifth PMOS transistor; and
    a third NMOS transistor, wherein a source of the fifth PMOS transistor is coupled to the power supply, a drain of the fifth PMOS transistor is coupled to a drain of the third NMOS transistor, and a source of the third NMOS transistor is coupled to the drain of the fourth PMOS transistor.

7. The differential signal buffer of claim 6, further comprising a capacitor coupled between the source and the drain of the third NMOS transistor and configured to provide a high frequency path between the source and the drain of the third NMOS transistor.

8. The differential signal buffer of claim 2, wherein the first buffer circuit further comprises a third power regulator circuit configured to provide a third current to the first NMOS transistor and to the first PMOS transistor based on a third level-shifted differential signal.

9. The differential signal buffer of claim 8, wherein the third power regulator circuit comprises:
   a fourth NMOS transistor; and
   a fifth NMOS transistor, wherein a source of the fourth NMOS transistor is coupled to ground, a drain of the fourth NMOS transistor is coupled to a source of the fifth NMOS transistor, and a gate of the fifth NMOS transistor is configured to receive the third level-shifted differential signal.

10. The differential signal buffer of claim 9, wherein the third power regulator circuit further comprises:
    a sixth NMOS transistor; and
    a sixth PMOS transistor, wherein a source of the sixth NMOS transistor is coupled to ground, a drain of the sixth NMOS transistor is coupled to a drain of the sixth PMOS transistor, and a source of the sixth PMOS transistor is coupled to the drain of the fifth NMOS transistor.

11. A method for buffering a differential input signal, the method comprising:
    receiving the differential input signal;
    coupling a source of a first PMOS transistor to a voltage supply and a drain of the first PMOS transistor to a source of a second PMOS transistor;
    receiving a first level-shifted differential signal via a gate of the second PMOS transistor;
    generating a first current, via the first PMOS transistor and the second PMOS transistor, based on the first level-shifted differential signal;
    generating a second current based on a second level-shifted differential signal; and
    generating a differential output signal based at least in part on the first current and the second current.

12. The method of claim 11, further comprising:
    coupling a source of a third PMOS transistor to a voltage supply and coupling a drain of the third PMOS transistor to a source of a fourth PMOS transistor;
    receiving the second level-shifted differential signal via a gate of the fourth PMOS transistor; and
    generating the second current via the third PMOS transistor and the fourth PMOS transistor.

13. The method of claim 11, further comprising:
    coupling a source of a first NMOS transistor to ground and coupling a drain of the first NMOS transistor to a source of a second NMOS transistor;
    receiving a third level-shifted differential signal via a gate of the second NMOS transistor; and
    generating a third current via the first NMOS transistor and the second NMOS transistor, wherein the differential output signal based at least in part on the third current.

14. The method of claim 11, further comprising:
    coupling a source of a third NMOS transistor to ground and coupling a drain of the third NMOS transistor to a source of a fourth NMOS transistor;
    receiving a fourth level-shifted differential signal via a gate of the fourth NMOS transistor; and
    generating a fourth current via the third NMOS transistor and the fourth NMOS transistor, wherein the differential output signal based at least in part on the fourth current.

15. A differential signal buffer, comprising:
    means for receiving a differential input signal;
    means for coupling a source of a first PMOS transistor to a voltage supply and a drain of the first PMOS transistor to a source of a second PMOS transistor;
    means for receiving a first level-shifted differential signal via a gate of the second PMOS transistor;
    means for generating a first current, via the first PMOS transistor and the second PMOS transistor, based on the first level-shifted differential signal;
    means for generating a second current based on a second level-shifted differential signal; and
    means for generating a differential output signal based at least in part on the first current and the second current.

16. The differential signal buffer of claim 15, further comprising:
    means for coupling a source of a third PMOS transistor to a voltage supply and coupling a drain of the third PMOS transistor to a source of a fourth PMOS transistor;
    means for receiving the second level-shifted differential signal via a gate of the fourth PMOS transistor; and
    means for generating the second current via the third PMOS transistor and the fourth PMOS transistor.

17. The differential signal buffer of claim 15, further comprising:
    means for coupling a source of a first NMOS transistor to ground and coupling a drain of the first NMOS transistor to a source of a second NMOS transistor;
    means for receiving a third level-shifted differential signal via a gate of the second NMOS transistor; and
    means for generating a third current via the first NMOS transistor and the second NMOS transistor, wherein the differential output signal based at least in part on the third current.

18. The differential signal buffer of claim 15, further comprising:
    means for coupling a source of a third NMOS transistor to ground and coupling a drain of the third NMOS transistor to a source of a fourth NMOS transistor;
    means for receiving a fourth level-shifted differential signal via a gate of the fourth NMOS transistor; and
    means for generating a fourth current via the third NMOS transistor and the fourth NMOS transistor, wherein the differential output signal based at least in part on the fourth current.

* * * * *